United States Patent [19]

Chang et al.

[11] Patent Number: 5,127,573
[45] Date of Patent: Jul. 7, 1992

[54] TAPE AUTOMATED BONDING APPARATUS WITH AUTOMATIC LEVELING STAGE

[75] Inventors: Shyh-Ming Chang; Jen-Huang Jeng, both of Hsinchu, Taiwan

[73] Assignee: Industrial Technology Research Institute, Hsinchu, Taiwan

[21] Appl. No.: 703,873

[22] Filed: May 22, 1991

[51] Int. Cl.⁵ .............................................. B23K 31/02
[52] U.S. Cl. .................. 228/180.2; 228/6.2; 228/5.5
[58] Field of Search ............... 228/5.5, 6.2, 106, 180.2

[56] References Cited

U.S. PATENT DOCUMENTS

| | | | |
|---|---|---|---|
| 3,448,911 | 6/1969 | Cushman | 228/44.7 |
| 3,574,923 | 4/1971 | Cushman | 228/180.2 |
| 4,565,314 | 1/1986 | Scholz | 228/180.2 |
| 4,896,811 | 1/1990 | Dunn et al. | 228/6.2 X |
| 4,982,890 | 1/1991 | Schuster et al. | 229/44.7 |

OTHER PUBLICATIONS

*Anonews,* vol. 9, No. 4, Jun. 1990, p. 1, Anorad Corp., Hauppauge, NY.
"Tab Tames High Density Chip Input/Outputs," Electronic Packaging and Production, Dec. 1988, pp. 42–44.

Primary Examiner—Richard K. Seidel
Assistant Examiner—Patty E. Hong
Attorney, Agent, or Firm—George O. Saile

[57] ABSTRACT

An improveent in a Tape Automated Bonding (TAB) apparatus wherein a support for the device being bonded to a tape, or film carrier, is provided that will automatically adjust the position of the device supported thereon to conform to the bonding surface of the thermode. The support of the invention has a central member that provides for swivelling and a second member that prevents relative rotation.

17 Claims, 3 Drawing Sheets

TAPE AUTOMATED BONDING APPARATUS WITH AUTOMATIC LEVELING STAGE

BACKGROUND OF THE INVENTION (1) Field of the Invention

The present invention relates to apparatus for bonding terminals of semiconductor devices to metal leads of plastic film carriers, more specifically to a flexible support stage that helps assure that a uniform pressure is applied to all leads and terminals during the actual bonding operation.

(2) Description of Prior Art

Tape automated bonding (TAB), though proposed many years ago, has finally found a niche in applications requiring chip connections beyond the capability of wire bonding. TAB provides the density for handling the high input/output terminal counts of VLSI chips, thereby keeping chip, or die, size to a manageable level for attaining a reasonable wafer yield. The driving force for TAB development and eventual use is high density. Wire bonding has reached its limit at bonding wires to pads on 6 mil centers along the periphery of the die. For example, a 300 input/output die, i.e. 75 bonds per edge, requires a die size of about 0.450 inches squared. The same application using TAB, where 4 mil contact centers are common (2 mil metal: 2 mil space), requires a reduced die size of about 0.300 inches square. This smaller die size allows approximately 120 more die per 5 inch wafer, while also offering a smaller device for higher packaging density.

When the number of input/output terminals on a chip to be bonded to the plastic film carrier or tape is low, the relative size of the gold bumps on the chips is relatively large, and the process is simple and reliable. However, as the number of terminals increases, the device becomes larger, and the gold bumps become smaller, the tolerances for producing complete bonding of all leads decreased significantly. The lace of chip planarity and the inherent variations in the gold bumps height has been the most troublesome aspects of the gang bonding of high input/output devices, in general, when the number of input/outputs exceed 200. The results can be non-bonded leads, and cracked chips.

In FIG. 1 there is illustrated a Prior Art TAB bonding apparatus wherein a device input/output, provided with input/output terminal bumps, is supported on a base plate 14. A plastic film carrier 16, provided with leads 18, is located over device 10 with the ends of leads 18 positioned over bumps 12. A thermode 20 is shown positioned over the device 10 in bonding position. The lower surface of thermode 20 is in a plane that is parallel to the plane defined by the tops of bumps 12. This relationship is the desired one which will result in good bonds between the leads 18 and bumps 12, and also will not expose harmful stresses on the device 10, because the pressure applied to the device by the thermode 20, will be uniform.

In FIG. 2 there is illustrated the same bonding apparatus, but where the plane of the lower surface of the thermode 20 is not in a plane that is parallel to the plane defined by the tops of bumps 12. As indicated, when the bonding operation is carried out the leads 18 on the right side, not in contact with thermode 20, will not be bonded to bumps 12, and cracks 22 in the device can result, because the stress is extreme.

This problem has been recognized, and efforts to remedy it include providing an adjustable support plate, as illustrated in FIG. 3. Here, the base plate 14 is mounted on an adjustable support plate in turn mounted on frame 24. The plane of the top surface of support plate 22 can be adjusted so that the plane defined by the tops of bumps 12 is parallel to the plane of the lower surface of thermode 20. This is accomplished by providing dowels 26, that extend from plate 24 into slidable relation within apertures 28 of plate 23. Plate 23 is thus vertically movable relative to plate 24, with very limited tilting permitted. A plurality of adjustabile screws, each provided with a head 32, seated in an enlarged hole 34, are used to hold the plate 23 in a desired plane. This arrangement accommmdates an adjustment for non planarity between the device and thermode, but requires a painstaking manual adjustment.

Other prior art covering the TAB process can be found in ANONEWS Vol. 9, No. 4, June 1990, Page 1, published by ANORAD Corp. of Hauppauge, N.Y. and "Tab Tames High Density Chip Input/Outputs", Electronic Packaging and Production, December 1988, Pages 42–44.

SUMMARY OF THE INVENTION

An object of the invention is to provide an automatically adjustable support for a device i n a TAB apparatus that will adjust the position of the device for optimum, bonding conditions.

The above object of the invention is achieved by providing, in a TAB apparatus, a support for the device being bonded having plate for supporting the device, a central swivel element supporting the plate, and a means to prevent rotation of the plate.

Other objects, features and advantages of the present invention will be apparent from the following detailed description when read in conjunction with the accompanying drawings.

DESCRIPTION OF THE PREFERRED EMBODIMENTS

Figure 1:
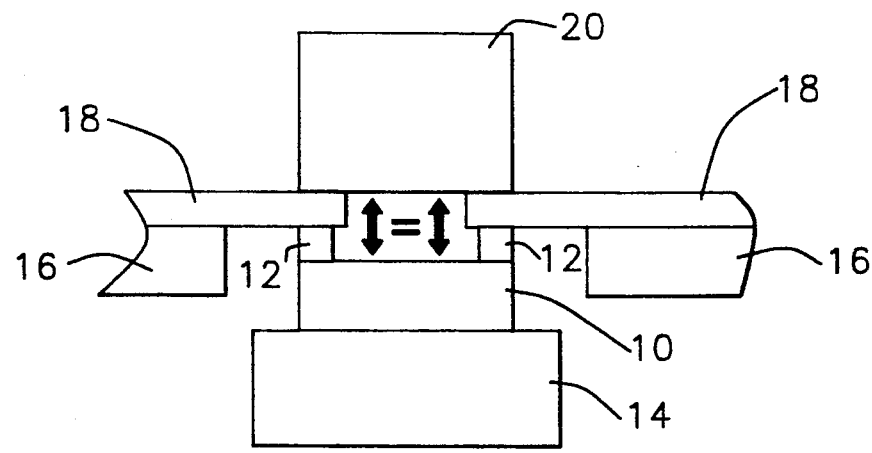
FIG. 1 and 2 are side views of a typical TAB bonding apparatus which illustrate the problem presented by non-planarity of the device and thermode.
Figure 2:
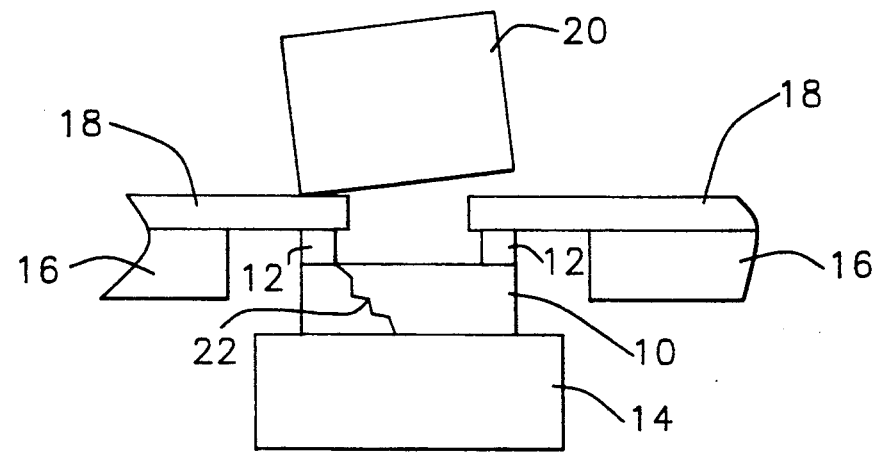
Figure 3:
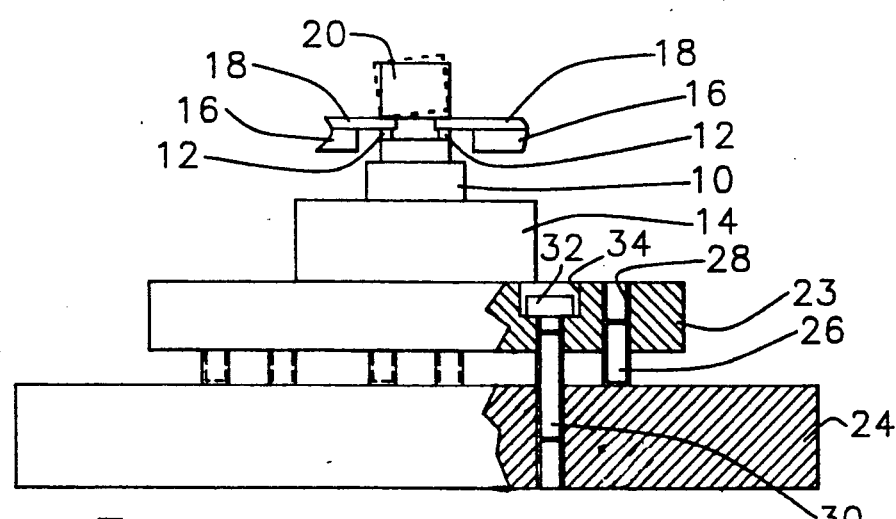
FIG. 3 illustrates a prior art solution to the non-planarity problem.
Figure 4:
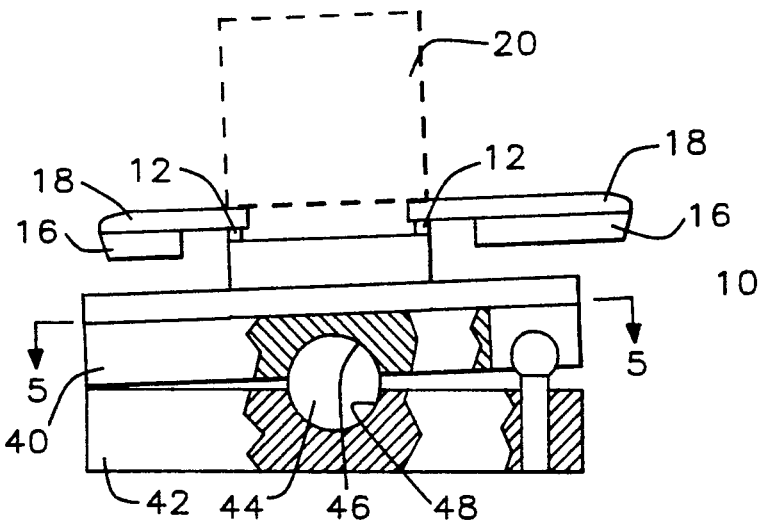
FIG. 4 is a front view, in partial section, of the automatic adjustable support of the present invention.

Referring now to the drawings, and FIG. 4 in particular, there is illustrated a preferred specific embodiment of the support for the device being bonded. The support for device 10, includes a first support plate or support member 40, and a second support plate or lower member 42 positioned beneath plate 40, and mounted on a frame (not shown). Also a spherical ball 44 seated in hemi spherical recesses 46 and 48, in plates 40 and 42 respectively. The depth of recesses 46 and 48 is made to maintain a distance between the plates so that a swiveling movement is possible. Typically, the ball 44 will have a diameter of between about 2 mm. to 4 mm., and the plates will be spaced a distance in the range of about 0.5 to 1mm.

Figure 5:
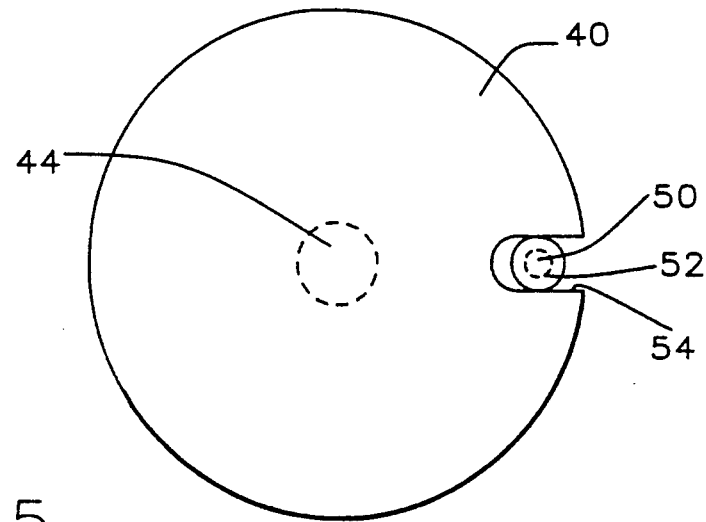
FIG. 5 is a top view of FIG. 4 taken on line 5-5.
Figure 6:
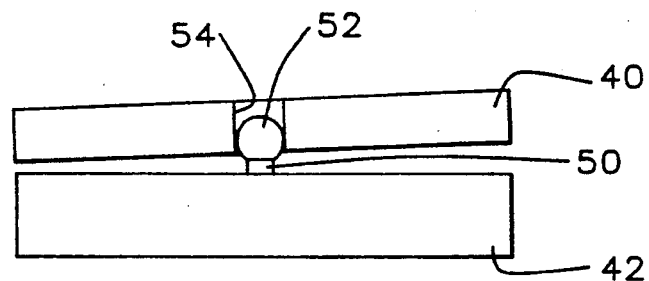
FIG. 6 is a side view of FIG. 4.

As shown more clearly in FIG. 5, a means is provided to present relative rotation between plates 40 and 42. Rotation is prevented by providing a projection 50, depending from plate 42 and spaced outwardly from ball 44, having an enlarged spherical upper end 52, that is received in a radial slot 54. The radial depth of slot 54 is greater than the diameter of spherical end 52, but the width is the same as the diameter of end 52. This configuration allows relative tilting of the plates but very precisely limits relative rotation.

Figure 7:
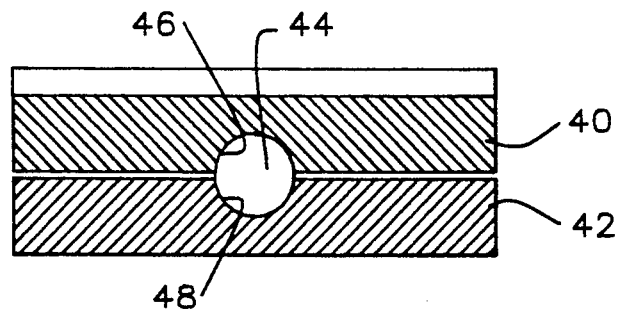
FIG. 7, 8, and 9 illustrate different preferred specific embodiments of the present invention.
Figure 8:
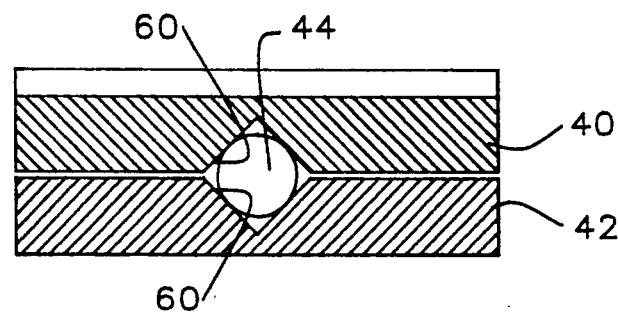
Figure 9:
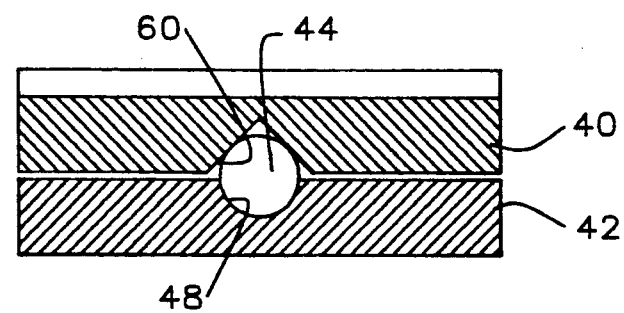

FIG. 7, 8, and 9 illustrate various types and combinaitons of recesses in lates 40 and 42 top receive ball 44. In FIG. 7, both of the recesses 46 and 48 are hemispherical. In FIG. 8, there is provided conical recesses 60, that receive ball 44. The conical recesses are easier to machine than hemispeherical recesses, but provide less support surface for the ball. In FIG. 9, there is provided a combination of a hemispherical surface 48 and a conical surface 60.

While the invention has been particularly shown and described with reference to the preferred emboidments thereof, it will be understood by those skilled in the art that various changes in from and details may be made without departing from the spririt and scope of the invention.

What is claimed is:

1. In a tape automated bonding apparatus for fusing the metal leads of a plastic film carrier to gold bumped input/output terminals of a semiconductor device, wherein the apparatus is provided with a frame, a base plate for supporting a semiconductor device that is supported on the frame, a means to support the plastic film carrier with the metal leads positioned in close proximity to the input/output terminals, and a thermode having a flat surface that is movable into and out of contact with the metal leads, the improvement comprised of:
   a base plate capable of tilting in order to orient the plane of the input/output terminals to a spaced parallel plane matching the surface plane of the thermode;
   said base plate having a support member for supporting a device;
   a lower member supported by the frame;
   a central swivel element mounted between said support member and said lower member; and
   a means to prevent relative rotation between said support member and said lower member above the horizontal axis of the swivel element;
   said means to prevent relative rotation including an outwardly extending elongated slot having parallel sidewalls in one of said members, and a post provided with a spherical surface mounted on the other of said members that is received in said slot, the diameter of the spherical surface being equal to the width of said slot.

2. The improved tape automated bonding apparatus of claim 1 wherein said swivel element is comprised of a spherical ball positioned in opposed recesses in said members, said spherical ball maintaining said members in spaced relationship.

3. The improved tape automated bonding apparatus of claim 2 wherein at least one of said opposed recesses has a hemispherical surface of said spherical ball.

4. The improved tape automated bonding apparatus of claim 2 wherein at least one of said opposed recesses has a conical surface.

5. The improved tape automated bonding apparatus of claim 3 wherein both of said members have recesses with hemispherical surfaces.

6. The improved tape automated bonding apparatus of claim 4 wherein both of said opposed recesses have conical surfaces that receive said spherical ball.

7. The improved tape automated bonding apparatus of claim 3 wherein the other of said opposed recesses has a conical surface.

8. The improved tape automated bonding apparatus of claim 1, wherein said lower member is a plate that is similar in size to said support member.

9. The improved tape automated bonding apparatus of claim 1 wherein said support member is a flat plate having a circular shape, and said lower member is a flat plate having a circular shape.

10. The improved tape automated bonding apparatus of claim 1 wherein said thermode is capable of simultaneously bonding in excess of about 300 input/output terminals to corresponding metal leads of a film carrier.

11. A tape automatic bonding apparatus having automatically adjustable semiconductor device support for fusing the metal leads of a plastic film carrier to gold bumped I/O terminals of the semiconductor device comprising:
   a frame having a base plate for supporting said semiconductor device that is supported on the frame;
   a means to support the plastic film carrier with the metal leads positioned in close proximity to the input/output terminals;
   a thermode having a flat surface that is movable into and out of contact with the metal leads;
   said base plate capable of tilting in order to orient the plane of the input/output terminals to a spaced parallel plane matching the surface plane of the thermode;
   said base plate having a support member for supporting a device; a lower member supported by the said frame;
   a central swivel, element mounted between said support member and said lower member; and
   a means to prevent relative rotation between said support member and said lower member above the horizontal axis of the swivel element;
   said means to prevent relative rotation including an outwardly extending elongated slot having parallel sidewalls in one of said members, and a post provided with a spherical surface mounted on the other of said members that is received in said slot, the diameter of the spherical surface being equal to the width of said slot.

12. The improved tape automated bonding apparatus of claim 11 wherein said swivel element is comprised of a spherical ball positioned in opposed recesses in said members, said spherical ball maintaining said members in spaced relationship.

13. The improved tape automated bonding apparatus of claim 12 wherein at least one of said opposed recesses has a hemispherical surface of said spherical ball.

14. The improved tape automated bonding apparatus of claim 12 wherein at least one of said opposed recesses has a conical surface.

15. The improved tape automated bonding apparatus of claim 13 wherein both of said members have recesses with hemispherical surfaces.

16. The improved tape automated bonding apparatus of claim 14 wherein both of said opposed recesses have conical surfaces that receive said spherical ball.

17. The improved tape automated bonding apparatus of claim 1, wherein said post supporting said spherical surface has a smaller diameter than the diameter of the hemispherical surface.

* * * * *